United States Patent
Higuchi et al.

(10) Patent No.: US 9,203,053 B2
(45) Date of Patent: Dec. 1, 2015

(54) LUMINESCENCE ELEMENT, LIGHTING DEVICE INCLUDING THE SAME, AND METHOD FOR MANUFACTURING THE SAME

(71) Applicant: Panasonic Intellectual Property Management Co., Ltd., Osaka (JP)

(72) Inventors: Toshihiro Higuchi, Osaka (JP); Mitsuo Yaguchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/559,992

(22) Filed: Dec. 4, 2014

(65) Prior Publication Data

US 2015/0179980 A1 Jun. 25, 2015

(30) Foreign Application Priority Data

Dec. 20, 2013 (JP) ................................. 2013-264098

(51) Int. Cl.
*H01L 33/00* (2010.01)
*H01L 51/52* (2006.01)
*H01L 51/56* (2006.01)
*H01L 51/00* (2006.01)

(52) U.S. Cl.
CPC ........ *H01L 51/5268* (2013.01); *H01L 51/0021* (2013.01); *H01L 51/0023* (2013.01); *H01L 51/5206* (2013.01); *H01L 51/56* (2013.01)

(58) Field of Classification Search
CPC ...... H01L 33/42; H01L 51/50; H01L 51/5036
USPC ...................................... 257/98, 95, E21.007
See application file for complete search history.

(56) References Cited

U.S. PATENT DOCUMENTS

2008/0129193 A1 6/2008 Asabe et al.

FOREIGN PATENT DOCUMENTS

| JP | 2002-179954 | 6/2002 |
|---|---|---|
| JP | 2008-130449 | 6/2008 |
| JP | 2009-501426 | 1/2009 |
| JP | 2010-205532 | 9/2010 |
| WO | 2007/008774 | 1/2007 |

*Primary Examiner* — Tan N Tran
(74) *Attorney, Agent, or Firm* — Renner, Otto, Boisselle & Sklar, LLP

(57) ABSTRACT

A luminescence element includes a substrate, a first electrode layer located on the substrate, a second electrode layer located above the first electrode layer and arranged to oppose the first electrode layer, and an emitting layer between the first electrode layer and the second electrode layer. The second electrode layer includes a light-transmitting conductive layer that contains a conductive polymer and a cured resin in which constituent molecules are crosslinked with one another.

9 Claims, 9 Drawing Sheets

LUMINESCENCE ELEMENT, LIGHTING DEVICE INCLUDING THE SAME, AND METHOD FOR MANUFACTURING THE SAME

This Application claims priority to Japanese Patent Application No. 2013-264098, filed on Dec. 20, 2013, the contents of which are hereby incorporated by reference.

BACKGROUND

1. Technical Field

The present disclosure relates to a luminescence element that includes two electrode layers and an emission layer sandwiched between the electrode layers, a lighting device including the luminescence element, and a method for manufacturing the luminescence element.

2. Description of the Related Art

Organic electro luminescence (EL) elements that utilize an electroluminescence phenomenon of organic materials have recently been proposed as luminescence elements for use in light-emitting devices such as lighting devices and display devices. A typical organic EL element includes a substrate, an anode located on the substrate, a cathode located above the anode, and a functional layer that is located between the anode and the cathode and includes an emitting layer.

FIG. 9 is a cross-sectional view illustrating a structure of a light-emitting device 100 described in Japanese Unexamined Patent Application Publication No. 2008-130449. The light-emitting device 100 includes a substrate 110, a light-transmitting electrode layer 140, an emitting layer 150, a counter electrode layer 160, and a sealing layer 170 laminated in that order. The substrate 110 is translucent. The light-transmitting electrode layer 140 serves as an anode and includes a pattern electrode layer 120 and a light-transmitting conductive layer 130. The counter electrode layer 160 serves as a cathode. When a voltage is applied between the light-transmitting electrode layer 140 and the counter electrode layer 160 of the light-emitting device 100, holes and electrons injected into the emitting layer 150 recombine and emission occurs in the emitting layer 150. Light generated in the emitting layer 150 passes through the substrate 110 and is emitted downward. In other words, the light-emitting device 100 has a bottom-emission structure. The pattern electrode layer 120 has a net-like shape in plan view and is composed of a material having a higher conductivity than the light-transmitting electrode layer 140. Because of the pattern electrode layer 120, all parts of the surface of the light-emitting device 100 can emit light uniformly.

A light-emitting device in which a scattering layer containing scattering particles that scatter light is located instead of the pattern electrode layer on a light-transmitting conductive layer has been proposed in, for example, Japanese Unexamined Patent Application Publication (Translation of PCT Application) No. 2009-501426. Because of the scattering layer, all parts of the surface of the light-emitting device can emit light uniformly.

SUMMARY

Recently, light-emitting devices have become larger in size and luminescence elements used in light-emitting devices have been increasingly required to achieve uniform emission within luminescent areas.

One non-limiting and exemplary embodiment provides a luminescence element that suppresses brightness unevenness. Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

A luminescence element according to one embodiment of the present disclosure includes a substrate, a first electrode layer located on the substrate, a second electrode layer located above the first electrode layer and arranged to oppose the first electrode layer, and an emitting layer between the first electrode layer and the second electrode layer. The second electrode layer includes a light-transmitting conductive layer that contains a conductive polymer and a cured resin in which constituent molecules are crosslinked with one another.

Note that general and specific embodiments may be realized through lighting devices, lighting systems, electronic devices, and methods, or any combinations of these.

DETAILED DESCRIPTION

Findings that LED to the Present Disclosure

In a bottom-emission-structure luminescence element of related art, the pattern electrode layer is thin. This is because a thick pattern electrode layer will increase the ruggedness of surfaces of a light-transmitting conductive layer and an emitting layer located on the pattern electrode layer and thus brightness unevenness occurs in the luminescence element. In order to decrease the resistance of the pattern electrode layer having a small thickness, the area of the pattern electrode layer needs to be increased. As a result, the opening area of the luminescence element has been small, which is undesirable. To address this issue, the possibility of using a pattern electrode layer in a top-emission-structure luminescence element that emits light from the side opposite to the substrate has been explored. According to this structure, a pattern electrode layer is formed on a light-transmitting conductor layer or an emitting layer and thus can have a large thickness. As a result, the area of the pattern electrode layer can be decreased and the opening area of the luminescence element can be increased.

Figure 10:
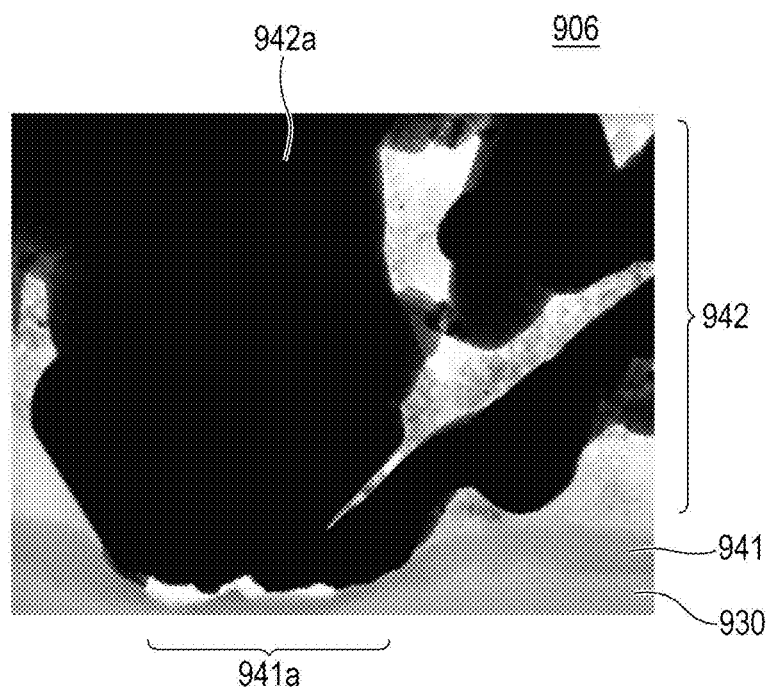
FIG. 10 is an enlarged cross-sectional image of a luminescence element of a comparative example.

However, it has been found that using a pattern electrode layer in a top-emission-structure luminescence element may cause brightness unevenness. It has also been found that brightness unevenness also occurs by using a scattering layer instead of the pattern electrode layer. This phenomenon has been earnestly studied and it has been found that thickness reduction in some part of a light-transmitting conductive layer is the cause of this phenomenon. FIG. 10 is an enlarged cross-sectional view of the portion near the interface between a light-transmitting conductive layer and a pattern electrode layer in a top-emission-structure luminescence element. The cause of this phenomenon is described below with reference to FIG. 10.

Referring to FIG. 10, a luminescence element 906 has a structure in which a functional layer 930, a light-transmitting conductive layer 941, and a pattern electrode layer 942 are laminated in that order. The thickness of the light-transmitting conductive layer 941 of the luminescence element 906 is decreased in a partial region 941a.

Typically, a pattern electrode layer 942 is formed by applying a paste containing metal particles 942a by printing. During this process, the metal particles 942a in the paste are pressed against the light-transmitting conductive layer 941 due to the pressure of printing. Moreover, since a water-soluble non-crosslinking resin is typically used as a binder resin contained in the light-transmitting conductive layer 941, the hardness of the light-transmitting conductive layer 941 is relatively low. Accordingly, when a pattern electrode layer 942 is formed on such a light-transmitting conductive layer 941 with low hardness, the metal particles 942a penetrate the light-transmitting conductive layer 941 due to the pressure of printing. Presumably, the thickness of the light-transmitting conductive layer 941 decreases in the partial region 941a due to such penetration. This penetration of metal particles does not always occur but is considered to occur easily if the metal particles have a sharp shape or the light-transmitting conductive layer has defects. The same phenomenon is considered to occur also in the case where a scattering layer containing scattering particles is formed instead of a pattern electrode layer by a printing method.

When the thickness of the light-transmitting conductive layer is decreased in some region, concentration of electric current occurs in that region during operation of the luminescence element, resulting in brightness unevenness. In some cases, non-luminescent areas known as black dots may Occur. Furthermore, if the hardness of the light-transmitting conductive layer is low, it becomes difficult to protect the functional layer from impact or the like and the reliability of the luminescence element may be degraded.

To address these issues, an approach of increasing the hardness of the light-transmitting conductive layer has been taken and the feasibility of constructing a luminescence element including a light-transmitting conductive layer that includes a conductive polymer and a cured resin constituted by crosslinked molecules has been investigated. As a result, a luminescence element in which brightness unevenness is further suppressed has been made.

Summary of Embodiments Implementing the Present Disclosure

A first aspect of the present disclosure provides a luminescence element that includes a substrate, a first electrode layer located on the substrate, a second electrode layer located above the first electrode layer and arranged to oppose the first electrode layer, and an emitting layer between the first electrode layer and the second electrode layer. The second electrode layer includes a light-transmitting conductive layer that contains a conductive polymer and a cured resin in which constituent molecules are crosslinked with one another.

According to this aspect, thickness reduction in some part of the light-transmitting conductive layer can be suppressed even when a pattern electrode layer or a scattering layer is located on the light-transmitting conductive layer. Accordingly, current concentration in some part of the emission layer can be suppressed and, as a result, a luminescence element in which brightness unevenness is further suppressed can be obtained. Even in the case where a pattern electrode layer or the scattering layer is not located, the functional layer can be protected from impact and the like and the reliability of the luminescence element can be improved.

The second electrode layer may further include a pattern electrode layer located on the light-transmitting conductive layer, the pattern electrode layer being composed of a material having a higher conductivity than the light-transmitting conductive layer and having, in plan view, an opening. According to this structure, a luminescence element in which brightness unevenness is further suppressed can be obtained.

The luminescence element may further include a scattering layer configured to scatter light emitted from the emitting layer, the scattering layer being located on the second electrode layer and containing scattering particles. According to this structure, a luminescence element in which brightness unevenness is further suppressed can be obtained.

The cured resin may be a thermally cured resin or an ultraviolet cured resin. The cured resin may contain at least one selected from an acrylic compound, a polyurethane compound, a polyester compound, an epoxy compound, and an aziridine derivative compound.

The light-transmitting conductive layer may have a single-layer structure in which the conductive polymer and the cured resin are mixed with each other. The light-transmitting conductive layer may have a conductivity in the range of 1,000 S/m to 100,000 S/m.

The luminescence element may further include a transparent member located above the second electrode layer.

A second aspect of the present disclosure provides a luminescence element that includes a substrate, a first electrode layer located on the substrate, a second electrode layer located above the first electrode layer and arranged to oppose the first electrode layer, and an emitting layer between the first electrode layer and the second electrode layer. The second electrode layer includes a light-transmitting conductive layer that contains a conductive polymer, a resin, and a curing agent.

A third aspect of the present disclosure provides a lighting device that includes a luminescence element and a drive circuit electrically connected to the first electrode layer and the second electrode layer of the luminescence element and configured to supply current between the first electrode layer and the second electrode layer.

A fourth aspect of the present disclosure provides a method for manufacturing a luminescence element. The method includes (a) forming a first electrode layer on a substrate, (b) forming an emitting layer above the first electrode layer, and (c) forming a light-transmitting conductive layer above the emitting layer. The forming (c) includes (1) applying a mixture of a conductive polymer and a resin material and (2) curing the resin material by heating or ultraviolet irradiation.

The method may further include (d) forming a pattern electrode layer having, in plan view, an opening on the light-transmitting conductive layer by applying a paste containing metal particles to the light-transmitting conductive layer and drying the applied paste.

The method may further include (e) forming a scattering layer on the light-transmitting conductive layer by applying a paste containing scattering particles to the light-transmitting conductive layer and drying the applied paste.

Luminescence elements and lighting devices including the luminescence elements according to embodiments will now be described with reference to the drawings.

First Embodiment

A lighting device 1 according to a first embodiment is described with reference to FIGS. 1 to 4B.
Structure of Lighting Device 1

Figure 1:
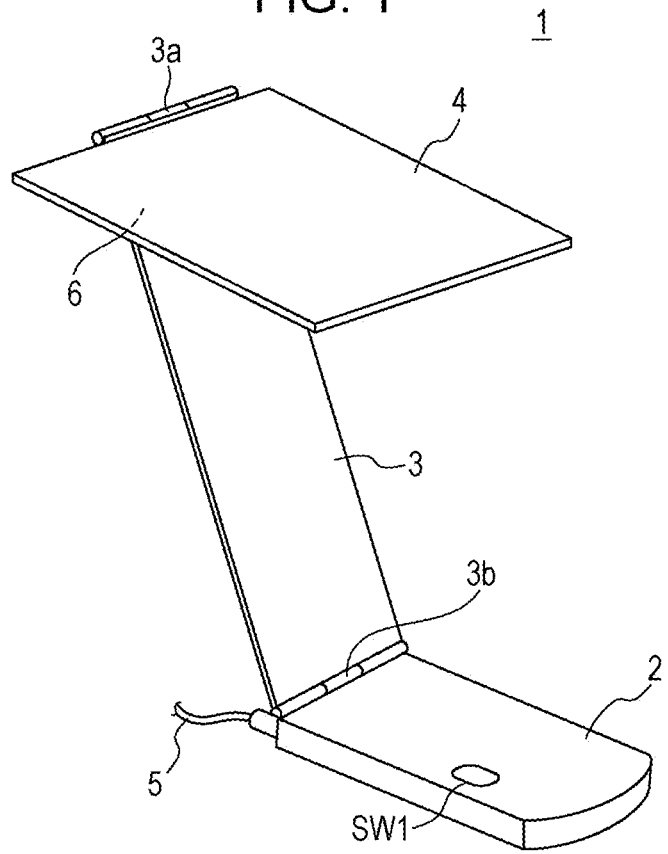
FIG. 1 is an exterior view of a lighting device according to a first embodiment.

FIG. 1 is an exterior view of the lighting device 1 according to the first embodiment. The lighting device 1 is of a desk light-type and includes a base 2, an arm unit 3, a head 4, wiring 5, and a luminescence element 6. The lighting device 1 emits light downward.
Base 2

A drive circuit configured to light the luminescence element 6 is built inside the base 2. A power switch SW1 is located on the upper surface of the base 2. The wiring 5 through which power is supplied to the drive circuit from an outside source is connected to the posterior of the base 2.
Arm Unit 3

The arm unit 3 has a coupling portion 3a at one end in the longitudinal direction and a coupling portion 3b at the other end. The coupling portion 3a is coupled to the head 4 and the coupling portion 3b is coupled to the base 2.

Wiring for electrically connecting the drive circuit to the luminescence element 6 in the head 4 is built inside the arm unit 3.
Head 4

Figure 2:
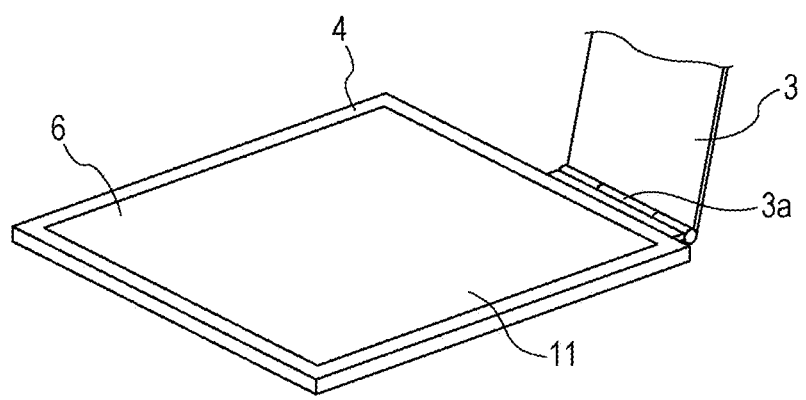
FIG. 2 is a partial exterior view of the lighting device according to the first embodiment.
Figure 3:
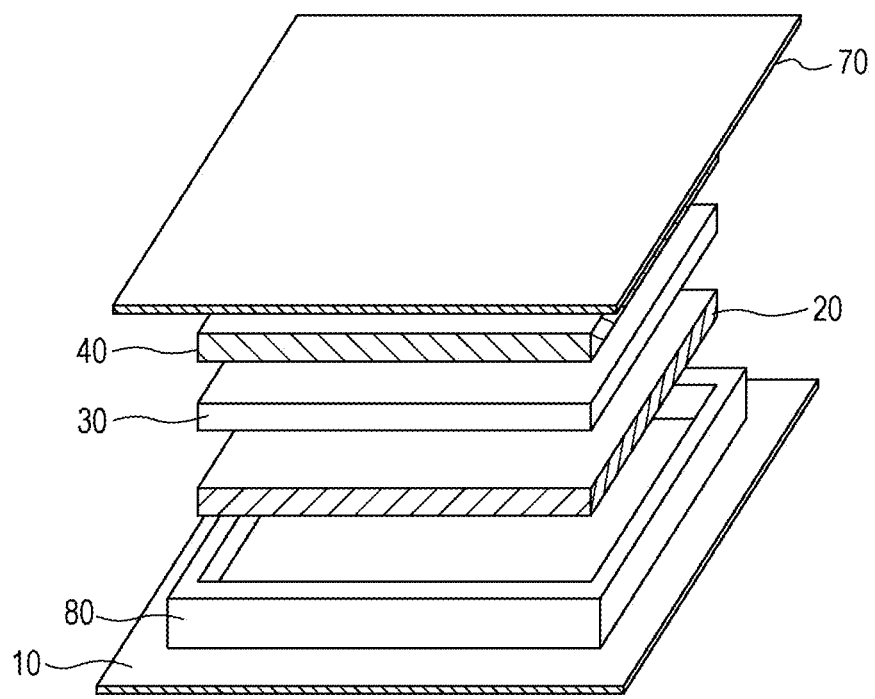
FIG. 3 is an exploded perspective view illustrating the outline of an internal structure of a luminescence element according to the first embodiment.

FIG. 2 is a partial exterior view of a portion near the head 4 of the lighting device 1 as viewed from the lower side. The head 4 includes the luminescence element 6 serving as a lighting unit of the lighting device 1. Light is emitted from an emitting surface 11 of the luminescence element 6 in the head 4.
Luminescence Element 6
1. Summary of Structure As illustrated in an exploded perspective view of FIG. 3, the luminescence element 6 includes a substrate 10, a first electrode layer 20, a functional layer 30, a second electrode layer 40, a sealing substrate 70, and a frame 80. In the specification, the direction in which light is emitted from the luminescence element 6 is the upward direction and the direction opposite to the light-emitting direction is the downward direction. The first electrode layer 20 is located on the upper surface of the substrate 10. The second electrode layer 40 is located on the upper surface side with respect to the substrate 10 and arranged to oppose the first electrode layer 20. The functional layer 30 is located between the first electrode layer 20 and the second electrode layer 40. In the luminescence element 6, the first electrode layer 20 serves as a cathode and the second electrode layer 40 serves as an anode. A first carrier injected from the first electrode layer 20 into the functional layer 30 is an electron and a second carrier injected from the second electrode layer 40 into the functional layer 30 is a hole.

Figure 4A:
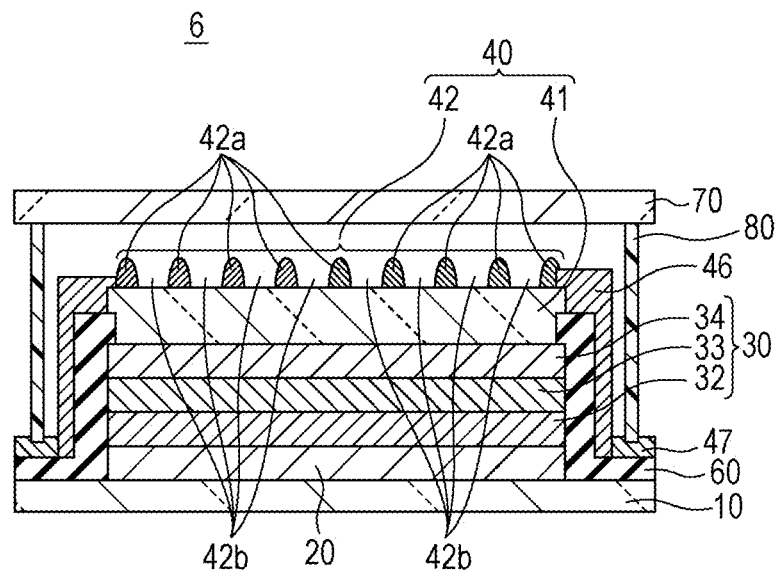
FIG. 4A is a cross-sectional view illustrating an internal structure of the luminescence element according to the first embodiment.

As illustrated in a cross-sectional view of FIG. 4A, the functional layer 30 includes an emitting layer 32, a second carrier transport layer 33, and a second carrier injection layer 34. The second electrode layer 40 includes a light-transmitting conductive layer 41 in contact with the functional layer 30 and having a light-transmitting property and a pattern electrode layer 42 having openings 42b through which light is extracted from the functional layer 30. Since the light-transmitting conductive layer 41 has a light-transmitting property, it becomes possible to extract light from the second electrode layer 40 side. As such, the luminescence element 6 is used as a top-emission-type luminescence element. The pattern electrode layer 42 has a higher conductivity than the light-transmitting conductive layer 41. Thus, power can be uniformly supplied to all parts of a luminescent region 6a of the luminescence element 6 illustrated in FIG. 4B, and uniform emission can be achieved. The light-transmitting conductive layer 41 is, for example, a layer that contains a conductive polymer such as one based on polythiophene, and a cured resin constituted by crosslinked molecules of an acrylic compound, for example.

Referring to FIG. 4A, the luminescence element 6 further includes an insulating layer 60. The insulating layer 60 is located on the upper surface side of the substrate 10 and covers the upper surface of the substrate 10, a side surface of the first electrode layer 20, a side surface of the functional layer 30, and an outer peripheral portion of the upper surface of the functional layer 30, the upper surface being on the second electrode layer 40 side. The sealing substrate 70 is a cover substrate arranged to oppose the upper surface of the substrate 10. The frame 80 is located between the periphery of the substrate 10 and the periphery of the sealing substrate 70 and has a frame shape (in this embodiment, a rectangular frame shape). In the luminescence element 6, the first electrode layer 20, the functional layer 30, the second electrode layer 40, and other associated components are contained in a space surrounded by the substrate 10, the sealing substrate 70, and the frame 80. Thus, the sealing properties of the first electrode layer 20, the functional layer 30, the second electrode layer 40, etc., can be enhanced and the reliability of the luminescence element 6 can be improved.

The luminescence element 6 further includes a first terminal (not illustrated) electrically connected to the first electrode layer 20 via a first lead wire (not illustrated) and a second terminal 47 electrically connected to the second electrode layer 40 via a second lead wire 46. The first lead wire, the first terminal, the second lead wire 46, and the second terminal 47 are located on the upper surface side of the substrate 10. The second lead wire 46 is electrically isolated from the functional layer 30, the first electrode layer 20, and the first lead wire by the insulating layer 60.

2. Individual Components

The individual components of the luminescence element 6 will now be described in detail.
Substrate 10

The substrate 10 has a rectangular shape in plan view. However, the shape of the substrate 10 in plan view is not limited to a rectangular shape and may be a polygonal shape other than the rectangular shape or a circular shape, for example.

A glass substrate is used as the substrate 10. Examples of the material thereof include soda lime glass and alkali-free glass.

The substrate 10 is not limited to a glass substrate. For example, a plastic plate or a metal plate may be used as the substrate 10. When a plastic plate is used as the substrate 10, the plastic plate may be composed of polyethylene terephthalate, polyethylene naphthalate, polyethersulfone, polycarbonate, or the like. When a plastic plate is used as the substrate 10, surfaces of the plastic plate are desirably coated with a SiON film, a SiN film, or the like to suppress permeation of water. When a metal plate is used as the substrate 10, the metal plate may be composed of aluminum, copper, stainless steel, or the like. The substrate 10 may be rigid or flexible.

Note that in the specification, the "substrate" refers to a component that supports the first electrode, the functional layer, the second electrode layer, etc., described below. Accordingly, in the case where an underlayer is formed on a surface of a glass substrate and a first electrode is formed on the underlayer, the combination of the glass substrate and the underlayer as a whole is referred to as a "substrate".

First Electrode Layer 20

The first electrode layer 20 serves as a cathode as discussed above. The material of the first electrode layer 20 may be an electrode material containing a metal, an alloy, an electrically conductive compound, or a mixture of the foregoing having a small work function. Specifically, the material of the first electrode layer 20 may be a material having a work function of 1.9 eV or more and 5.0 eV or less in order not to excessively widen the difference between the lowest unoccupied molecular orbital (LUMO) level of the functional layer 30 and the work function of the first electrode layer 20.

Examples of the material of the first electrode layer 20 include aluminum, silver, magnesium, gold, copper, chromium, molybdenum, palladium, tin, and alloys of these metals and alloys of these metals and other metals, e.g., a magnesium-silver mixture, a magnesium-indium mixture, and an aluminum-lithium alloy. Other examples of the material of the first electrode layer 20 include a mixture of a metal, a metal oxide, and/or another metal. For example, a laminate that includes an aluminum oxide ultrathin film (a thin film 1 nm or less in thickness in which electrons can flow due to tunneling injection) and an aluminum thin film can be used. In the case where the first electrode layer 20 is to be used as a reflective electrode, the material of the first electrode layer 20 can be a metal having a high reflectance for light emitted from the emitting layer 32 and low resistivity. For example, the first electrode layer 20 may be composed of aluminum or silver. The thickness of the first electrode layer 20 may be 80 nm to 200 nm.

Functional Layer 30 i. Laminate Structure

The functional layer 30 includes, in the order from the first electrode layer 20 side, the emitting layer 32, the second carrier transport layer 33, and the second carrier injection layer 34. The second carrier transport layer 33 and the second carrier injection layer 34 respectively serve as a hole transport layer and a hole injection layer. In the case where the first electrode layer 20 serves as an anode and the second electrode layer 40 serves as a cathode, for example, the second carrier transport layer 33 may serve as an electron transport layer and the second carrier injection layer 34 may serve as an electron injection layer.

The emitting layer 32 may have a single layer structure or a multilayer structure. For example, when the desired color of emission from the emitting layer 32 is white, the emitting layer 32 may be doped with three kinds of dopant coloring matter, namely, red, green and blue dopant coloring matter. The emitting layer 32 may have, for example, a multilayer structure including a blue emitting layer having a hole transport property, a green emitting layer having an electron transport property, and a red emitting layer having an electron transport property or a multilayer structure including a blue emitting layer having an electron transport property, a green emitting layer having an electron transport property and a red emitting layer having an electron transport property.

The thickness of the emitting layer 32 may be 60 nm to 200 nm. The thickness of the second carrier transport layer 33 may be 5 nm to 30 nm. The thickness of the second carrier injection layer 34 may be 10 nm to 60 nm.

ii. Materials

Materials of the emitting layer 32, the hole transport layer, and the hole injection layer will now be specifically described.

Emitting Layer 32

Examples of the material of the emitting layer 32 include polyparaphenylene vinylene derivatives, polythiophene derivatives, polyparaphenylene derivatives, polysilane derivatives, and polyacetylene derivatives. The material of the emitting layer 32 is not limited to the compounds derived from fluorescent coloring matter such as those described above and may be a phosphorescent material. Examples of the phosphorescent material include luminescent materials such as iridium complexes, osmium complexes, platinum complexes, and europium complexes and compounds or polymers that contain such complexes in the molecules. The material of the emitting layer 32 is not limited to those described above and any suitable material can be selected and used as needed.

The emitting layer 32 can be formed by a wet process such as a coating method (for example, a spin coating method, a spray coating method, a die coating method, a gravure printing method, or a screen printing method). Alternatively, the emitting layer 32 may be formed by a process other than the coating method and, for example, may be formed by a dry process such as a vacuum vapor deposition method or a transfer method.

Hole Transport Layer

Materials having low molecular weights and high molecular weights that have a low LUMO level can be used as the material of the hole transport layer. Examples of the material of the hole transport layer include, but are not limited to, aromatic amine-containing polymers such as polyarylene derivatives having aromatic amines in side chains and/or main chains, e.g., polyvinylcarbazole (PVCz), polypyridine, and polyaniline.

Hole Injection Layer

Examples of the material of the hole injection layer include, but are not limited to, organic materials that contain thiophene, triphenyl methane, hydrazaline, amylamine, hydrazone, stilbene, triphenylamine, and the like. These materials can be used alone or in combination.

The hole injection layer can be formed by a wet process such as a coating method (e.g., a spin coating method, a spray coating method, a die coating method, or a gravure printing method).

Second Electrode Layer 40

The second electrode layer 40 serves as an anode and includes the light-transmitting conductive layer 41 and the pattern electrode layer 42 as discussed above.

Light-Transmitting Conductive Layer 41

The light-transmitting conductive layer 41 contains a conductive polymer and a cured resin used as a binder and constituted by crosslinked molecules.

Examples of the conductive polymer contained in the light-transmitting conductive layer 41 include polythiophene, polyaniline, polypyrrole, polyphenylene, polyphenylenevinylene, polyacetylene, and polycarbazole. The conductive polymer may be doped with a dopant to increase conductivity. Examples of the dopant include sulfonic acid, Lewis acids, protonic acids, alkali metals, and alkaline-earth metals. The resistivity of the light-transmitting conductive layer 41 is desirably low. The lower the resistivity of the light-transmitting conductive layer 41, the more improved the current-carrying property in the horizontal direction (in-plane direction); thus, it becomes possible to reduce in-plane variation of the current flowing in the emitting layer 32 and suppress brightness unevenness.

The cured resin contained in the light-transmitting conductive layer 41 may be formed of a resin in which crosslinking and curing occur due to heat. Examples of such a resin include, but are not limited to, acrylic compounds, polyurethane compounds, polyester compounds, epoxy compounds, and aziridine derivative compounds. Known additives can be added to the cured resin if needed. Examples of the additives include a curing agent, an antifoaming agent, an antislip agent, a preservative, a rust-preventive agent, a pH adjustor, an antioxidant, a pigment, a dye, and a lubricant. Examples of the curing agent include organic oxides used to cure polyester and the like and isocyanates used to cure polyurethane.

The cured resin is dispersed among molecules of the conductive polymer and thus the light-transmitting conductive layer 41 as a whole exhibits conductivity. Specifically, the conductive polymer and the cured resin are mixed at such a ratio that the conductivity of the light-transmitting conductive layer 41 is in the range of 1,000 S/m to 100,000 S/m. The hardness of the light-transmitting conductive layer 41 containing the cured resin is higher than the hardness of the light-transmitting conductive layer formed by using a water-soluble binder as in related art.

The light-transmitting conductive layer 41 can be formed by performing printing by, for example, a screen printing method, a gravure printing method, or an ink jet printing method, and then performing heating. The thickness of the light-transmitting conductive layer 41 may be about 10 nm to 500 nm. From the viewpoint of the light transmitting property, the thickness is desirably about 10 nm to 150 nm.

Pattern Electrode Layer 42

The pattern electrode layer 42 contains a metal powder and an organic binder.

The metal contained in the pattern electrode layer 42 has a conductivity higher than that of the light-transmitting conductive layer 41. For example, the metal may be silver, gold, copper, or the like. Thus, the resistivity and the sheet resistance of the second electrode layer can be decreased compared to when a conductive transparent oxide is used in the second electrode layer. As a result, brightness unevenness of the luminescence element 6 can be suppressed. The metal contained in the pattern electrode layer 42 is not limited to silver, gold, or copper and the pattern electrode layer 42 may contain an alloy, carbon black, or the like.

Examples of the organic binder contained in the pattern electrode layer 42 include acrylic resins, polyethylene, polypropylene, polyethylene terephthalate, polymethyl methacrylate, polystyrene, polyethersulfone, polyarylate, polycarbonate resins, polyurethane, polyacrylonitrile, polyvinyl acetal, polyamide, polyimide, diacryl phthalate resins, cellulose-based resins, polyvinyl chloride, polyvinylidene chloride, polyvinyl acetate, and other thermoplastic resins. The organic binder may be a copolymer formed of two or more monomers constituting these resins. The organic binder is not limited to those described above.

The pattern electrode layer 42 can be formed by for example, preparing a paste (printing ink) by mixing a metal powder, an organic binder, and an organic solvent and performing printing by using the printing ink by a screen printing method, a gravure printing method, or an ink jet printing method, for example. The metal powder in the paste (printing ink) exists in the form of metal particles. A pattern electrode layer 42 can be formed at a low cost if a printing method is used.

Figure 4B:
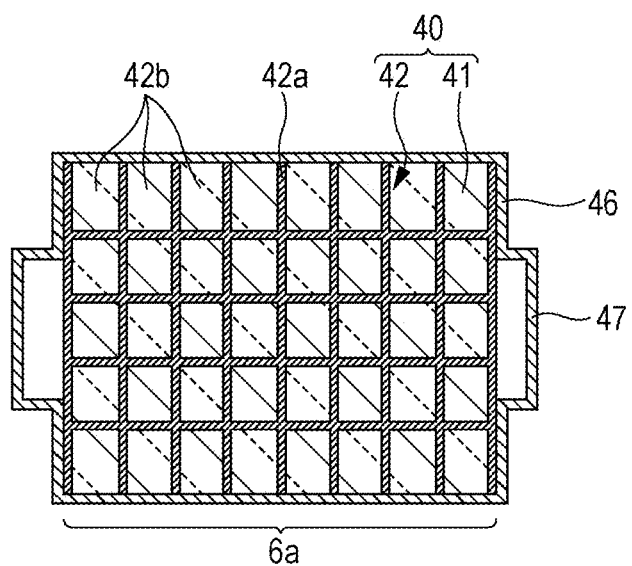
FIG. 4B is a plan view illustrating an internal structure of the luminescence element according to the first embodiment.

The pattern electrode layer 42 includes a wire electrode 42a and openings 42b. Referring to FIG. 4B, the wire electrode 42a is formed into a grid shape (net shape) and has plural (7×5=35 in the example illustrated in FIG. 4B) openings 42b. The shape of each opening 42b in plan view is rectangular.

Figure 5:
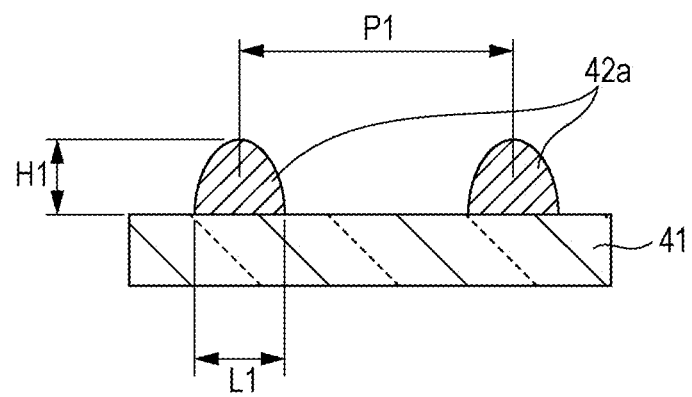
FIG. 5 is an enlarged cross-sectional view illustrating a part of the luminescence element according to the first embodiment.

The line width of the wire electrode 42a may be 200 μm or less and in particular 50 μm or less. The dimensions of the pattern electrode layer 42 are described in detail below by referring to an enlarged cross-sectional view of FIG. 5. For example, the wire electrode 42a may have a line width $L1$ of 1 μm to 100 μm, a height $H1$ of 50 nm to 100 μm, and a pitch $P1$ of 100 μm to 2000 μm. However, the numerical ranges for the line width $L1$, the height $H1$, and the pitch $P1$ of the wire electrode 42a are not particularly limited and may be appropriately set according to the dimensions of the luminescence element in plan. The line width $L1$ of the wire electrode 42a is desirably small from the viewpoint of external quantum efficiency of the luminescence element 6. However, the line width $L1$ is desirably large from the viewpoint of suppressing brightness unevenness by decreasing the resistance of the second electrode layer 40. The "external quantum efficiency" discussed here refers to a ratio of the number of photons radiated to the number of electrons injected into the emitting layer. The height $H1$ of the wire electrode 42a may be 100 nm or more and 10 μm or less. This height is desirable from the viewpoints of decreasing the resistance of the second electrode layer 40, efficiency of using the material of the wire electrode 42a in forming the pattern electrode layer 42 by a coating method such as a screen printing method (material usage efficiency), and the angle of radiation of light emitted from the functional layer 30.

As illustrated in FIG. 4A, the shape of each opening 42b is designed so that the area of the opening gradually increases upward with respect to the functional layer 30. Due to this shape, the spread angle of light emitted from the functional layer 30 can be increased. As a result, the brightness unevenness of the luminescence element 6 can be further suppressed. Moreover, the reflection loss and absorption loss at the pattern electrode layer 42 can be decreased and the external quantum efficiency of the luminescence element 6 can be further improved.

When the wire electrode 42a is formed to have a grid shape, the shape of each opening 42b in plan view is not limited to a rectangular shape. For example, a square shape, an equilateral triangle shape, or a regular hexagon shape may be employed. The wire electrode 42a may have a comb shape or a shape in which two or more comb shapes are combined. The number of the openings 42b is not particularly limited to a plural and may be one. For example, in the case where the wire electrode 42a is formed of single comb-shaped member or a member in which two comb shapes are combined, the number of the openings 42b may be 1 in some cases.

Second Lead Wire 46 and Second Terminal 47

The materials of the second lead wire 46 and the second terminal 47 may be the same as that of the pattern electrode layer 42 of the second electrode layer 40. In such a case, the second lead wire 46, the second terminal 47, and the pattern electrode layer 42 can be simultaneously formed. Alternatively, the materials of the second lead wire 46 and the second terminal 47 may be different from each other. The second lead wire 46 and the second terminal 47 may each have a single layer structure or a multilayer structure including two or more layers.

Insulating Layer 60

The insulating layer 60 is located between the substrate 10 and the second lead wire 46 and between the substrate 10 and the second terminal 47. Examples of the material of the insulating layer 60 include polyimide, novolac resins, epoxy resins, and urethane resins. When these materials are used, the insulating layer 60 can be formed by, for example, a screen printing method or a gravure printing method.

Sealing Substrate 70

The sealing substrate 70 is a transparent member and functions as a cover substrate. The sealing substrate 70 may be a glass substrate but is not limited to this. For example, a plastic plate may be used. Examples of the material of the glass substrate include soda lime glass and alkali-free glass. Examples of the material of the plastic plate include polyethylene terephthalate, polyethylene naphthalate, polyethersulfone, and polycarbonate.

A substrate having a flat plate shape is used as the sealing substrate 70 in the luminescence element 6. However, the substrate is not limited to this. A substrate having a storing recess in the surface opposing the substrate 10 may be used as the sealing substrate 70 so that the first electrode layer 20, the functional layer 30, the second electrode layer 40, and other associated parts can be housed in the storing recess, and the entire outer periphery of the storing recess may be bonded to the substrate 10. According to this structure, a separate frame 80 is no longer needed and the number of parts can be decreased. In the case where a sealing substrate 70 having a flat plate shape and a frame 80 having a frame shape are prepared as separate parts, a material that has optical properties (for example, light transmittance and refractive index) required for the sealing substrate 70 and a material that has physical properties (for example, a gas barrier property) required for the frame 80 can be used in the respective parts.

Frame 80

The frame 80 is a frame-shaped member located between the periphery of the substrate 10 and the periphery of the sealing substrate 70. Examples of the material of the frame 80 include polyimide, novolac resins, and epoxy resins. The gap between the frame 80 and the substrate 10 and the gap between the frame 80 and the sealing substrate 70 are hermetically bonded with a bonding member. An epoxy resin can be used as the bonding material of the bonding member but the bonding material is not limited to this. For example, an acrylic resin may be used. The epoxy resin or acrylic resin used as the bonding material may be of a UV-curable type or of a thermosetting type, for example. A mixture of an epoxy resin and a filler (for example, silica, alumina, or the like) can also be used as the bonding material.

3. Manufacturing Method

A method for manufacturing the luminescence element 6 will now be described with reference to FIGS. 6A to 6E and 7A to 7C. FIGS. 6A to 6E and 7A to 7C are schematic views illustrating the respective steps of the method for manufacturing the luminescence element 6.

Figure 6A:
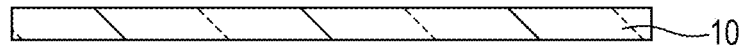
FIGS. 6A to 6E are schematic views illustrating a method for manufacturing the luminescence element according to the first embodiment.
Figure 6B:
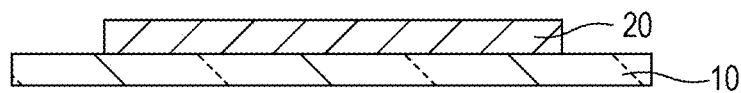

Referring to FIGS. 6A and 6B, a first electrode layer 20 is formed on an upper surface of a substrate 10 by a thin-film process such as a vacuum vapor deposition method or a wet process such as a coating method.

Figure 6C:
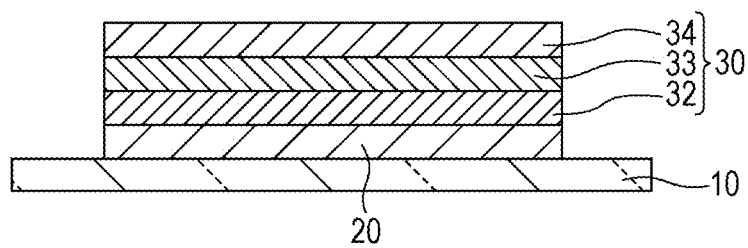

Referring to FIG. 6C, an ink is applied to the first electrode layer 20 by a wet process such as a coating method (for example, a spin coating method, a spray coating method, a die coating method, a gravure printing method, or a screen printing method) and the solvent is dried to form an emitting layer 32. The same process is used to form a second carrier transport layer 33 (hole transport layer) and a second carrier injection layer 34 (hole injection layer). As a result, a functional layer 30 is obtained.

Figure 6D:
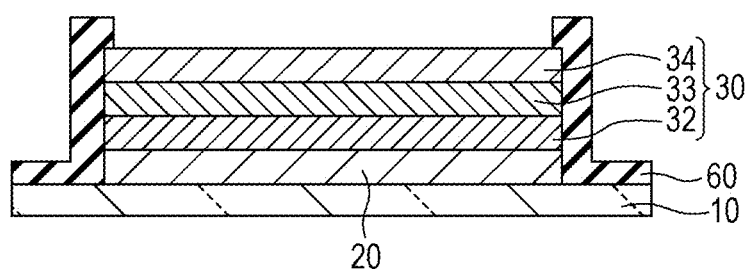

Referring to FIG. 6D, an insulating layer 60 is formed so as to contact the side surfaces of the first electrode layer 20, the emitting layer 32, the second carrier transport layer 33, and the second carrier injection layer 34. The insulating layer 60 may be formed by applying an ink by a screen printing method, a gravure printing method, or the like, and drying the solvent, for example.

Figure 6E:
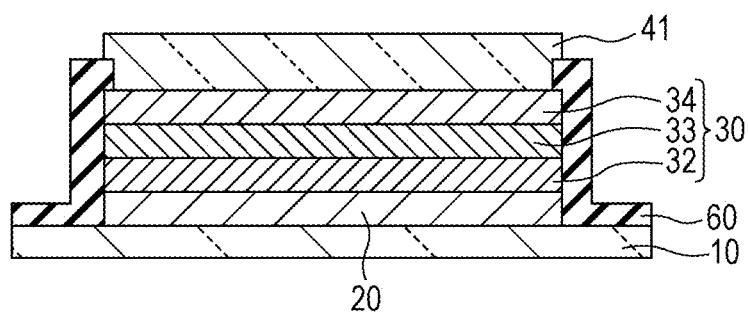

Referring to FIG. 6E, an ink containing a conductive polymer and a material of the cured resin is applied to the second carrier injection layer 34 by a coating method and the solvent is dried. Then the ink is heated at 130° C. for 10 minutes to thermally cure the material of the cured resin contained in the ink. As a result, a light-transmitting conductive layer 41 is obtained.

Figure 7A:
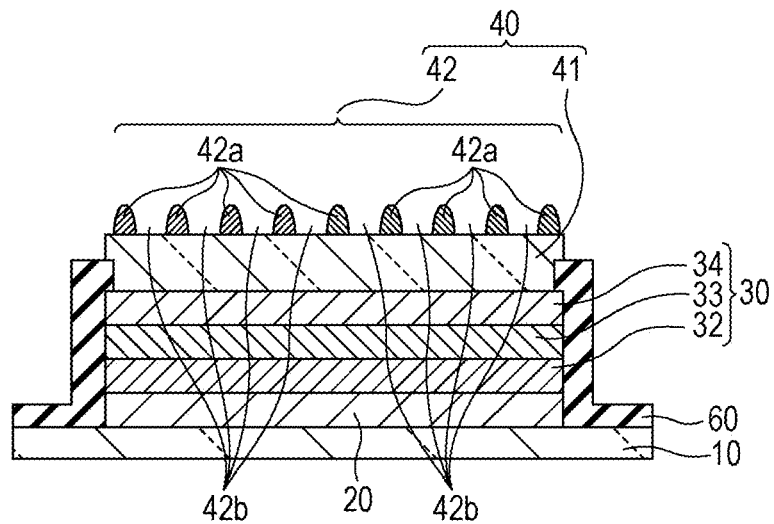
FIGS. 7A to 7C are schematic views illustrating a method for manufacturing the luminescence element according to the first embodiment.

Referring to FIG. 7A, a pattern electrode layer 42 having a rectangular grid shape is formed by applying an ink to the light-transmitting conductive layer 41 by, for example, a coating method and drying the solvent.

Figure 7B:
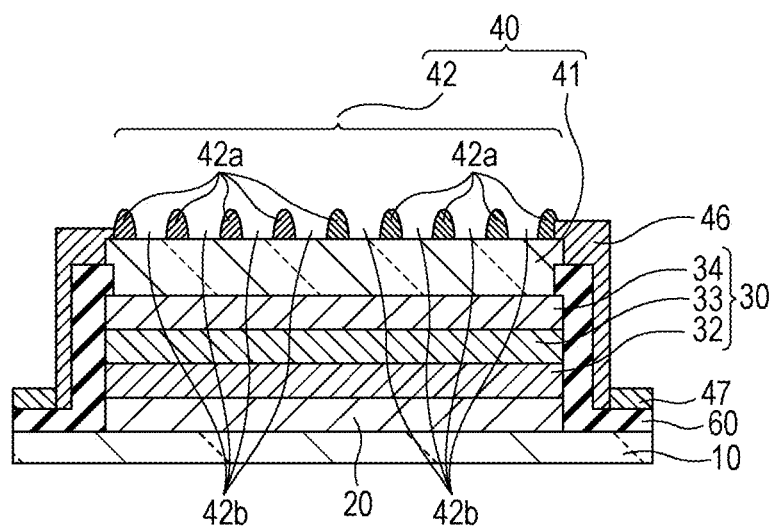

Referring to FIG. 7B, a second lead wire 46 is formed by applying an ink by a coating method and drying the solvent so that the second lead wire 46 makes contact with the light-transmitting conductive layer 41 and the pattern electrode layer 42. Simultaneously, a second terminal 47 that is continuous with the second lead wire 46 is formed on the left side of the upper surface of the substrate 10.

Figure 7C:
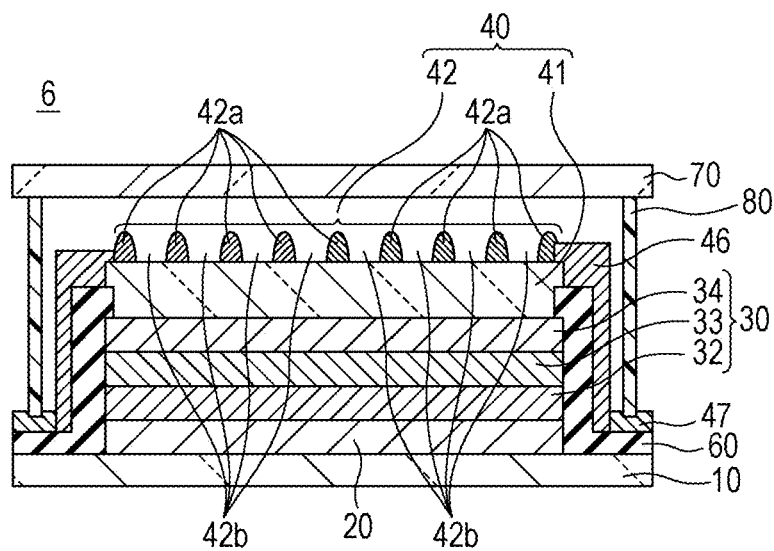

Referring to FIG. 7C, a frame 80 is formed at the periphery of the substrate 10. Examples of the material of the frame 80 include polyimide resins, novolac resins, and epoxy resins. The frame 80 is bonded to the upper surface of the substrate 10 with a bonding material composed of an epoxy resin or the like. Then the sealing substrate 70 is bonded to the upper surface of the frame 80 with a bonding material composed of an epoxy resin or the like.

As a result of performing the above-described steps, a luminescence element 6 is obtained.

4. Effects

The light-transmitting conductive layer 41 of the luminescence element 6 contains a conductive polymer such as a polythiophene-based conductive polymer and a cured resin constituted by crosslinked molecules. Accordingly, the hardness of the light-transmitting conductive layer 41 is higher than the hardness of a light-transmitting conductive layer of related art that does not contain a cured resin.

Thus, the functional layer 30 can be protected from the impact or the like and the reliability of the luminescence element can be improved. In the printing step of the pattern electrode layer 42, metal particles contained in the paste are less likely to penetrate the light-transmitting conductive layer 41 and thickness-reduction in some part of the light-transmitting conductive layer 41 can be suppressed. Accordingly, it becomes possible to suppress concentration of electric current in some part of the emitting layer 32 and thus the brightness unevenness of the luminescence element 6 can be further suppressed. Note that a luminescence element of related art that includes a light-transmitting conductive layer not containing a cured resin has 5 mm$^2$ to 10 mm$^2$ of black dots per 100 cm$^2$, for example. In contrast, in the luminescence element 6, occurrence of black dots is suppressed to about 1 mm$^2$ per 100 cm$^2$.

The light-transmitting conductive layer 41 that contains a cured resin has high stability. Accordingly, compared to a light-transmitting conductive layer that does not contain a cured resin, the resistance to corrosion caused by an adhesive or the like can be improved. As a result, a highly reliable luminescence element 6 can be provided.

Second Embodiment

Figure 8:
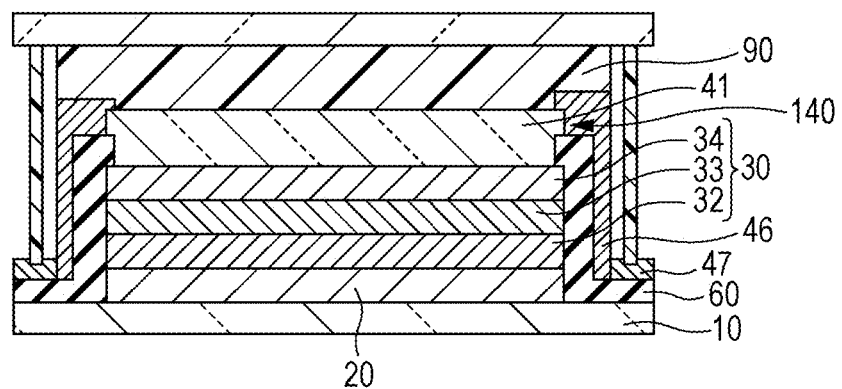
FIG. 8 is a schematic cross-sectional view of a luminescence element according to a second embodiment.
Figure 9:
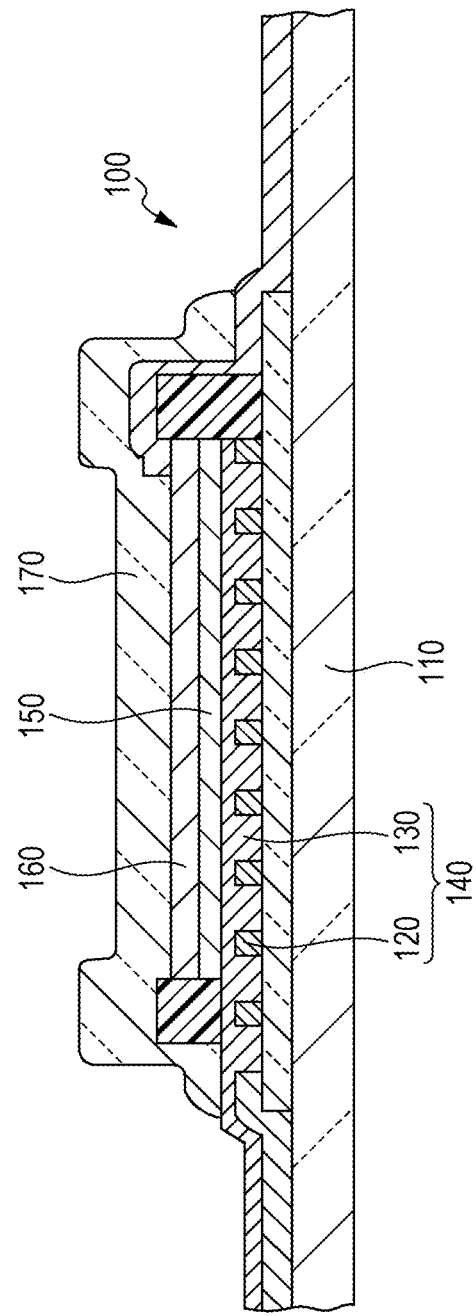
FIG. 9 is a schematic cross-sectional view of a luminescence element of related art.

FIG. 8 is a schematic cross-sectional view of a luminescence element 106 according to a second embodiment. The luminescence element 106 of the second embodiment differs from the luminescence element of the first embodiment in that there is no pattern electrode layer and a scattering layer that scatters light from an emitting layer is formed on the second electrode layer 40. The rest of the structure is identical to that of the first embodiment. The same components as those in the first embodiment are denoted by the same reference numerals and the descriptions therefor are omitted to avoid redundancy.

A scattering layer 90 is a layer in which scattering particles are dispersed in a binder. The ratio of the scattering particles to the binder is 1 wt % to 20 wt %. After the light-transmitting conductive layer 41 is formed, the scattering layer 90 is formed by applying a paste (printing ink) containing scattering particles, a binder, and an organic solvent by a screen printing method, a gravure printing method, an ink jet printing method, or the like, and drying the applied paste.

Examples of the scattering particles contained in the scattering layer 90 include, but are not limited to, silica, titania, and alumina. Examples of the binder contained in the scattering layer 90 include, but are not limited to, acrylic resins, polyethylene, polypropylene, polyethylene terephthalate, polymethyl methacrylate, polystyrene, polyethersulfone, polyarylate, polycarbonate resins, polyurethane, polyacrylonitrile, polyvinyl acetal, polyamide, polyimide, diacryl phthalate resins, cellulose-based resins, polyvinyl chloride, polyvinylidene chloride, polyvinyl acetate, and other thermoplastic resins, and a copolymer of two or more monomers constituting these resins. The diameter of the scattering particles may be 0.1 µm to 10 µm.

In this embodiment, the scattering layer 90 is formed on the light-transmitting conductive layer 41 having a high hardness. Accordingly, scattering particles in the scattering layer 90 are less likely to penetrate the light-transmitting conductive layer 41 during the printing step of the scattering layer 90. As a result, thickness-reduction in some part of the light-transmitting conductive layer 41 can be suppressed and concentration of the current in some part of the emitting layer 32 can be suppressed. Thus, the brightness unevenness of the luminescence element 6 can be further suppressed.

Other Modification Examples

The luminescence elements and lighting devices according to embodiments have been described above but the present disclosure is not limited to examples indicated in these embodiments. For example, the luminescence elements and lighting devices illustrated above may be modified as follows:

(1) In the first and second embodiments, a thermally cured resin is used as the cured resin constituted by crosslinked molecules. Alternatively, a UV-cured resin or the like may be used as the cured resin. Note that when a light-transmitting conductive layer is used as an electrode on the light extraction side as in the first embodiment, a thermally cured resin is desirable since there is no need to consider the influence of ultraviolet and the like on the emitting layer.

(2) In the luminescence element 6 of the first embodiment, the functional layer 30 includes, in order from the first electrode layer 20 side, the emitting layer 32, the second carrier transport layer 33, and the second carrier injection layer 34. The second carrier transport layer 33 and the second carrier injection layer 34 are a hole transport layer and a hole injection layer, respectively.

However, the functional layer 30 is not limited to the example described above. For example, a first carrier injection layer and a first carrier transport layer may be located between the first electrode layer 20 and the emitting layer 32. In this case, the first carrier injection layer is an electron injection layer and the first carrier transport layer is an electron transport layer.

Examples of the material of the electron injection layer include metal halides such as metal fluorides, e.g., lithium fluoride and magnesium fluoride, and metal chlorides, e.g., sodium chloride and magnesium chloride, and oxides of titanium, zinc, magnesium, calcium, barium, and strontium. When these materials are used, the electron injection layer can be formed by a vacuum vapor deposition method. An organic semiconductor material doped with a dopant (for example, an alkali metal) that accelerates electron injection may be used as the material of the electron injection layer. When such a material is used, the electron injection layer can be formed by a coating method.

The material of the electron transport layer can be selected from the group consisting of compounds having an electron transport property. Examples of the compounds include metal complexes such as Alq3 known as electron transport materials, and heterocycle-containing compounds such as phenanthroline derivatives, pyridine derivatives, tetrazine derivatives, and oxadiazole derivatives. However, the material is not limited to these and any appropriate electron transport material can be selected.

(3) In the luminescence element 6 of the first embodiment, the first electrode layer 20 serves as a cathode and the second electrode layer 40 serves as an anode. Alternatively, the first electrode layer 20 may serve as an anode and the second electrode layer 40 may serve as a cathode. In such a case, the second carrier transport layer is an electron transport layer and the second carrier injection layer is an electron injection layer. The materials described above can be used as the materials of the electron transport layer and the electron injection layer. The material of the first electrode layer serving as the anode is desirably a metal having a large work function. Specifically, a material having a work function of 4 eV or more and 6 eV or less can be used as the material of the first electrode layer so that the difference between the highest occupied molecular orbital (HOMO) level of the functional layer and the work function of the first electrode layer is not excessively wide.

(4) The functional layer 30 need only contain at least an emitting layer. In other words, the functional layer 30 may be constituted by an emitting layer only. Alternatively, an optional layer such as an interlayer may be included in the functional layer 30.

(5) The first embodiment and the second embodiment may be combined. In other words, a scattering layer may be formed on a second electrode layer that includes a light-transmitting conductive layer and a pattern electrode. According to this structure, the external quantum efficiency of a luminescence element can be further improved.

(6) The first embodiment, the second embodiment, and the modification examples may be combined in any way as long as the combination is structurally feasible.

It should be understood that the embodiments described above merely illustrate specific examples of the present disclosure. Numerals, shapes, materials, components, positions and connections of the components, steps, and the order of steps described in the embodiments are merely illustrative and do not limit the scope of the present disclosure. Among the components of the embodiments, the steps not described in independent claims representing the broadest concept of the present disclosure are described as optional features that are used in more desirable embodiments.

To promote understanding of the disclosure, the scale in which the components are illustrated in the respective drawings referred in the embodiments is sometimes different from the actual scale. The present disclosure is not limited to the embodiments described above and is subject to modifications and alterations as long as these modifications and alterations are within the essence of the present disclosure.

Moreover, the luminescence element and the lighting device also include other parts such as circuit parts and lead wires on substrates. Various embodiments of electrical wiring and electric circuits can be implemented based on common knowledge of the pertaining technical field but the description thereof is omitted here since such embodiments are irrelevant to the present disclosure. Also note that the drawings described above are schematic diagrams and do not necessarily represent accurate structures.

A luminescence element according to the present disclosure is useful as a light source of a lighting device or the like and is particularly useful in providing a luminescence element in which brightness unevenness is suppressed.

What is claimed is:

1. A luminescence element comprising:
   a substrate;
   a first electrode layer located on the substrate;
   a second electrode layer located above the first electrode layer and arranged to oppose the first electrode layer; and
   an emitting layer between the first electrode layer and the second electrode layer,
   wherein the second electrode layer includes a light-transmitting conductive layer that contains a conductive polymer and a cured resin in which constituent molecules are crosslinked with one another wherein the second electrode layer further includes a pattern electrode layer located on the light-transmitting conductive layer, the pattern electrode layer being composed of a material having a higher conductivity than the light-transmitting conductive layer and having, in plan view, an opening.

2. The luminescence element according to claim 1, further comprising:
   a scattering layer configured to scatter light emitted from the emitting layer, the scattering layer being located on the second electrode layer and containing scattering particles.

3. The luminescence element according to claim 1, wherein the cured resin is a thermally cured resin or an ultraviolet cured resin.

4. The luminescence element according to claim 1, wherein the cured resin contains at least one selected from an acrylic compound, a polyurethane compound, a polyester compound, an epoxy compound, and an aziridine derivative compound.

5. The luminescence element according to claim 1, wherein the light-transmitting conductive layer has a single-layer structure in which the conductive polymer and the cured resin are mixed with each other.

6. The luminescence element according to claim 5, wherein the light-transmitting conductive layer has a conductivity in the range of 1,000 S/m to 100,000 S/m.

7. The luminescence element according to claim 1, further comprising:
   a transparent member located above the second electrode layer.

8. A luminescence element comprising:
   a substrate;
   a first electrode layer located on the substrate;
   a second electrode layer located above the first electrode layer and arranged to oppose the first electrode layer; and
   an emitting layer between the first electrode layer and the second electrode layer,
   wherein the second electrode layer includes a light-transmitting conductive layer that contains a conductive polymer, a resin, and a curing agent wherein the second electrode layer further includes a pattern electrode layer located on the light-transmitting conductive layer, the pattern electrode layer being composed of a material having a higher conductivity than the light-transmitting conductive layer and having, in plan view, an opening.

9. A lighting device comprising:
   the luminescence element according to claim 1; and
   a drive circuit electrically connected to the first electrode layer and the second electrode layer of the luminescence element and configured to supply current between the first electrode layer and the second electrode layer.

* * * * *